United States Patent [19]
Mori et al.

[11] Patent Number: 5,847,974
[45] Date of Patent: Dec. 8, 1998

[54] MEASURING METHOD AND APPARATUS FOR MEASURING SYSTEM HAVING MEASUREMENT ERROR CHANGEABLE WITH TIME

[75] Inventors: Tetsuzo Mori, Atsugi; Koichi Sentoku, Utsunomiya; Takahiro Matsumoto, Utsunomiya; Noriyasu Hasegawa, Utsunomiya, all of Japan

[73] Assignee: Canon Kabushiki Kaisha, Tokyo, Japan

[21] Appl. No.: 520,641

[22] Filed: Aug. 29, 1995

[30] Foreign Application Priority Data

Aug. 30, 1994 [JP] Japan .................................. 6-230776
Aug. 23, 1995 [JP] Japan .................................. 7-237663

[51] Int. Cl.$^6$ .................................................. G01B 11/00
[52] U.S. Cl. .............................. 364/571.02; 364/571.01; 341/123
[58] Field of Search .................................. 364/560, 561, 364/565, 566, 571.01, 571.02, 579, 580; 341/123

[56] References Cited

U.S. PATENT DOCUMENTS 4,672,567  6/1987  Kelly et al. .............................. 364/572
5,146,417  9/1992  Watson .................................. 364/566
5,263,486  11/1993  Jeffreys ................................ 128/696
5,268,744  12/1993  Mori et al. .
5,309,197  5/1994  Mori et al. .
5,333,050  7/1994  Nose et al. .
5,432,603  7/1995  Sentoku et al. .

FOREIGN PATENT DOCUMENTS 04212002  8/1992  Japan .

OTHER PUBLICATIONS

Instrumentation for Engineering Measurements 2nd edition, Dally et al. John Wiley & Sons Inc., publishers, ©1984,1993 pf 380.

Primary Examiner—Emanuel T. Voeltz
Assistant Examiner—Craig Steven Miller
Attorney, Agent, or Firm—Fitzpatrick, Cella, Harper & Scinto

[57] ABSTRACT

A method of measuring information related to an object, includes the steps of measuring a change of a measurement error with respect to time, and determining the frequency of measurements for measuring the measurement error, to be done during a measurement period, on the basis of the change in measurement error. Then, in the measurement period, a measured value is corrected by using a latest measurement error.

6 Claims, 10 Drawing Sheets j-TH SHOT

MEASURING METHOD AND APPARATUS FOR MEASURING SYSTEM HAVING MEASUREMENT ERROR CHANGEABLE WITH TIME

FIELD OF THE INVENTION AND RELATED ART

This invention relates to a measuring method and apparatus for a measuring system having a measurement error changeable with time. Particularly, the measuring method and apparatus of the present invention is suitably applicable to measurement of a positional deviation between two objects.

Japanese Laid-Open Patent Application, Laid-Open No. 212002/1992 shows a system for detecting a deviation between circuit patterns superposed and printed on a semiconductor substrate, wherein a dual frequency laser is used as a light source and the detection is based on the heterodyne interference method. In this system, diffraction gratings additionally formed by the superposed printing are used. A phase difference of beat signals from two diffraction lights is detected, and the relative positional deviation between the two diffraction gratings is measured. In such measuring system using a laser as a light source, the measurement operation starts after a sufficient warming-up time for the laser head, after turning the power source of the system on. Alternatively, the laser head is energized continuously throughout day and night so as to keep the system in a steady state. In this way, stable measurement performance is maintained, and high precision measurement is attained.

Usually, it is said that a commercially available laser head needs a warming-up time of about 30 minutes. However, in a high precision and high resolution positional deviation measuring system such as disclosed in the above-mentioned document, strict stableness of a laser light source is required. The warming-up time of about 30 minutes is not sufficient. Thus, a very long warming-up time is necessary, which applies large restriction to the operation time of the measuring system.

Further, the precision of a measuring system changes sensitively with a change in environment. This causes a problem of a decrease in reproducibility of the measured value.

FIG. 9 is a graph for explaining changes with time of the measured deviation in a case where a dual frequency laser is used as a light source and wherein the relative positional deviation between two diffraction gratings is measured on the basis of the heterodyne interference of diffraction lights. In this graph, the axis of the abscissas denotes time, and the axis of the ordinates denotes the measured value of the deviation between the diffraction gratings. These two diffraction gratings are provided with an inherent relative positional deviation $\Delta X = \Delta y = 0$. Thus, the measured value should be equal to zero. If however a variation in the drift characteristic or a variation in frequency remains in the projected beam of the laser light, the projected beam to the diffraction grating impinges on a position shifted from a correct measurement position. Namely, the two diffraction gratings are illuminated with eccentricity. If the positional deviation between the two diffraction gratings is measured in this state, $\Delta X$ and $\Delta Y$ are different from zero and have certain values. This can be said to be an apparent deviation (which corresponds to a measurement error of a measuring system changeable with time).

The graph of FIG. 9 shows that this apparent deviation changes with time toward zero. In FIG. 9, time O is the moment whereat, after warming-up of about tens minutes from the start of energization of a dual-frequency laser, the dual-frequency laser comes substantially into a steady state. Generally, a commercially available dual-frequency laser is equipped with an indicator or a signal output by which the steady state can be discriminated. Thus, time O can be determined.

In the term from time O to time A, that is, in the period OA, the measured value changes largely. In the subsequent period AB, the change become stable. However, in the period BC, the measured value changes largely again. Then, in the period CD, the change of measured value is converged, and the apparent deviation substantially become equal to zero and stable there.

For this reason, in a positional deviation measuring apparatus having a dual-frequency laser as a light source, it is necessary to continue the warming-up for a long time even after the laser light source is considered as having reached its steady state, such that the measurement operation should not be started until drift variation is completely extinguished. This substantially applies to high precision measuring systems having a laser as a light source.

SUMMARY OF THE INVENTION

It is an object of the present invention to provide an improved measuring method and apparatus by which a measured value, which contains a measurement error changeable with time and attributable to any instability of a laser light source or to any instability of environment, can be corrected at an appropriate stage in accordance with a required measurement precision.

In accordance with an aspect of the present invention, there is provided a method of measuring information related to an object, comprising the steps of: measuring a change of a measurement error with respect to time; determining frequency of measurements for measuring the measurement error, to be done during a measurement period, on the basis of the change in measurement error; and correcting, in the measurement period, a measured value by using a latest measurement error.

In one preferred form of this aspect of the present invention, the method may further comprise setting a time interval T for measurement of the measurement error in the measurement period to satisfy a relation $T \leq a/c$ wherein a is a rate of change of measurement error with respect to time and c is a desired measurement precision.

In accordance with another aspect of the present invention, there is provided a method of detecting the positional deviation between two objects, comprising the steps of: measuring a positional deviation of two references having a predetected mutual positional deviation, to detect a change, with respect to time, of a measurement error in the detection of the positional deviation of the two object; determining, on the basis of the change in measurement error, frequency of measurements for measuring the measurement error to be done during a measurement period for the measurement to the two objects, through detection of the positional deviation of the two references; and correcting, in the measurement period, a measured positional deviation of the two objects by using a latest measurement error.

In a preferred form of this aspect of the present invention, the method may further comprise setting a time interval T for measurement of the measurement error in the measurement period to satisfy a relation $T \leq a/c$, wherein a is a rate of change of the measurement error with respect to time and c is a desired measurement precision.

In accordance with a further aspect of the present invention, there is provided a positional deviation detecting system for detecting a positional deviation between two objects, comprising: two references having a predetected mutual positional deviation; memorizing means for memorizing a detected value of the positional deviation of the references; calculating means for calculating a change, with respect to time, of a measurement error in the detection of the positional deviation of the two object, on the basis of the memorized detected value of the positional deviation of the references; determining means for determining, on the basis of the change in measurement error, a frequency of measurements for measuring the measurement error to be done during a measurement period for the measurement to the two objects, through detection of the positional deviation of the two references; and correcting means for correcting, in the measurement period, a measured positional deviation of the two objects by using a latest measurement error.

In a preferred form of this aspect of the present invention, the system may further comprise means for setting a time interval T for measurement of the measurement error in the measurement period to satisfy a relation $T \leq a/c$ wherein a is a rate of change of the measurement error with respect to time and c is a desired measurement precision.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
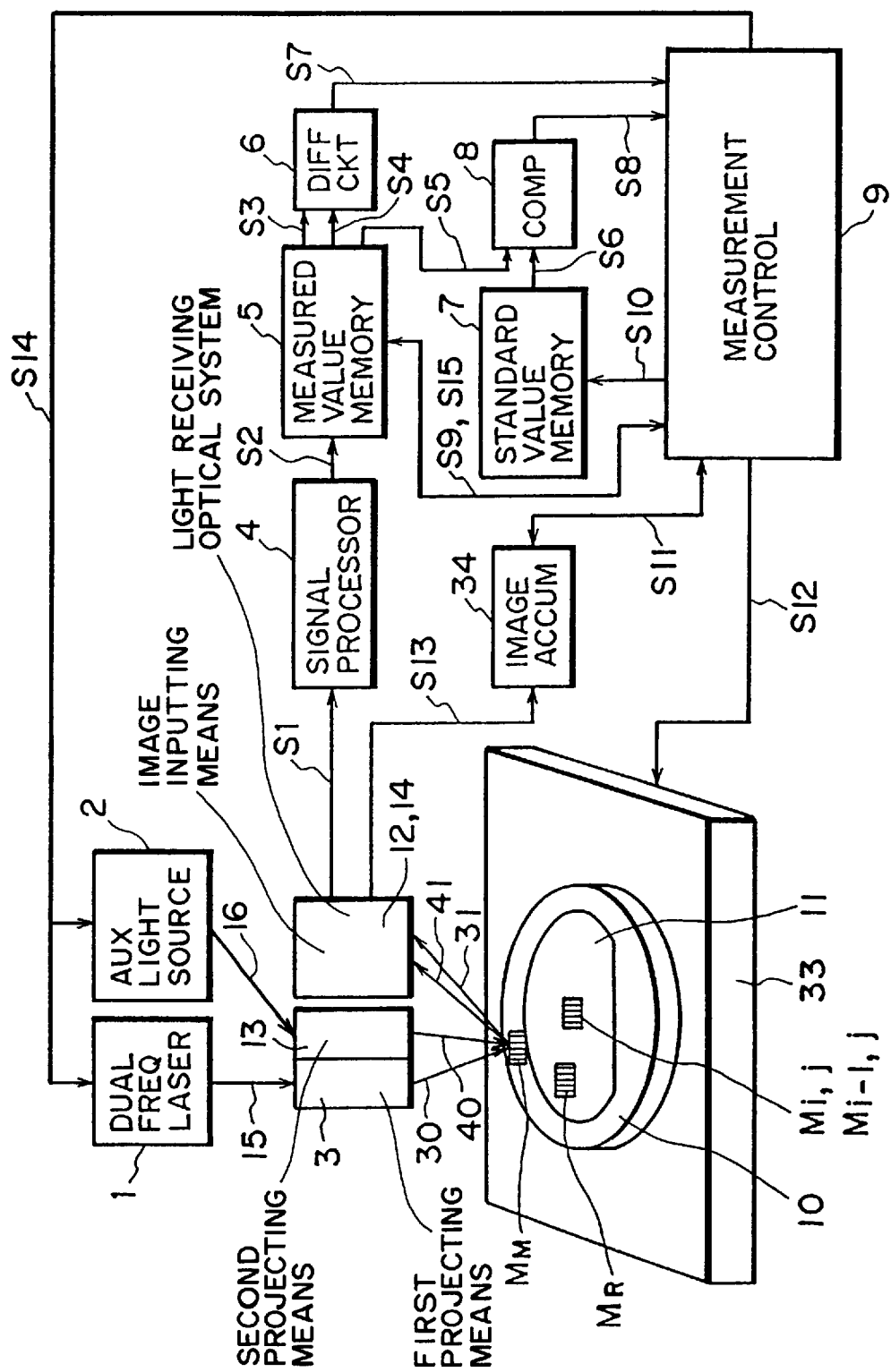
FIG. 1 is a schematic and diagrammatic view of a main portion of an embodiment of the present invention.

FIG. 1 is a schematic view of a main portion of a first embodiment of the present invention. In this embodiment, a positional deviation measuring system is incorporated into a semiconductor device manufacturing apparatus, for measurement of precision of superposition.

Figure 2A:
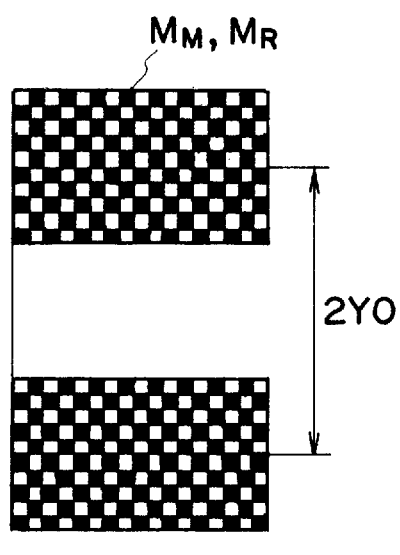
FIGS. 2A and 2B are schematic views for explaining a stableness monitoring mark, a reference mark and a measurement mark.
Figure 2B:
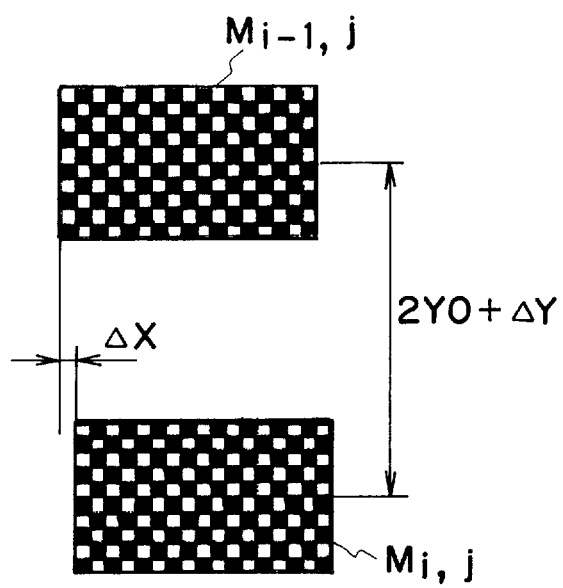
Figure 3:
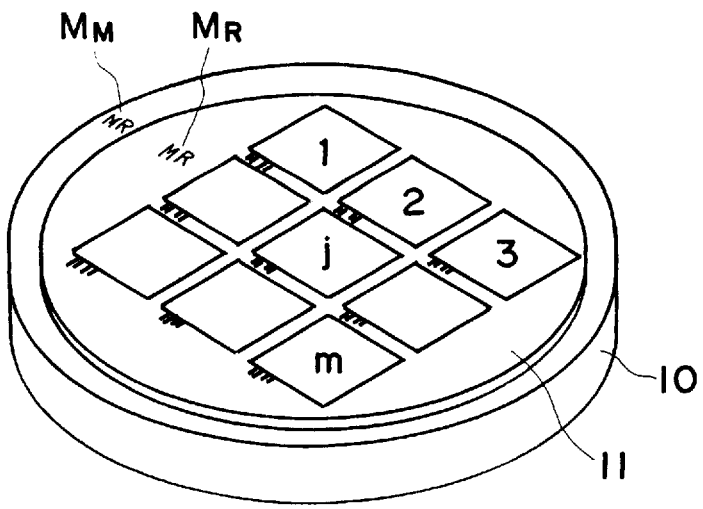
FIG. 3 is a perspective view of a semiconductor substrate placed on a substrate supporting portion of the FIG. 1 apparatus.
Figure 4:
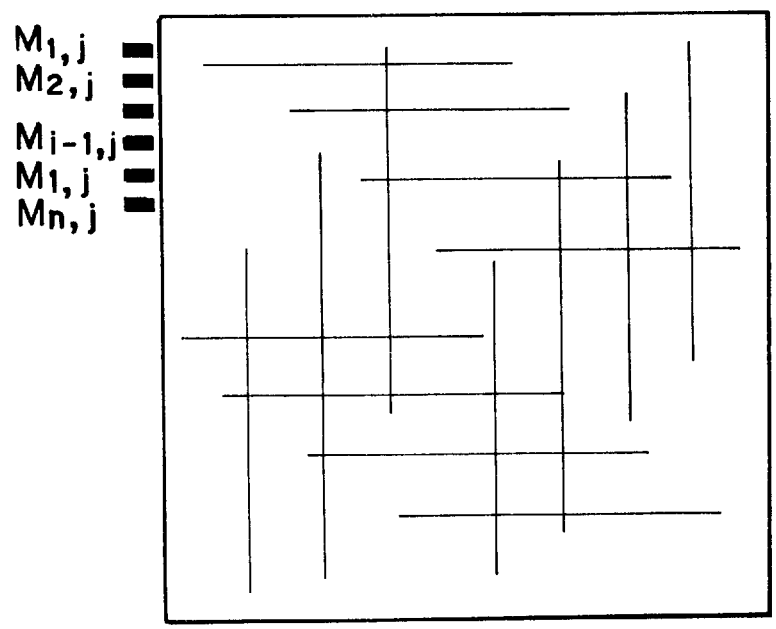
FIG. 4 is a schematic view for explaining a measurement mark of FIG. 1.

FIG. 2 illustrates a stableness measuring mark, a reference mark and a measurement mark of FIG. 1, and FIG. 3 is a perspective view of a semiconductor substrate 11 placed on a semiconductor substrate supporting portion 10 of FIG. 1. FIG. 4 illustrates a measurement mark of FIG. 1.

In these drawings, denoted at $M_M$ is a mark having a pattern such as shown in FIG. 2A and constituted by two diffraction gratings, for example. It is provided on the semiconductor substrate supporting portion 10, at a position juxtaposed to the semiconductor substrate 11. Namely, in this pattern, the two diffraction gratings have a designed relative deviation $\Delta X=\Delta Y=0$. Hereinafter, these two diffraction gratings $M_M$ will be referred to as "stableness monitoring mark". Also, the measurement of the relative positional deviation of the stableness monitoring mark will be referred to as "measurement of stableness monitoring mark", and a measure value thereof, that is, a measurement error of the measuring system will be referred to as "measured value of stableness monitoring mark".

Denoted at $M_R$ is a mark having a pattern similar to the stableness monitoring mark of FIG. 2A, and constituted by two diffraction gratings, for example. It is formed on the semiconductor substrate 11 in advance through semiconductor processes. Hereinafter, these two diffraction gratings will be referred to as "reference mark", and measurement of a relative positional deviation of the reference mark (diffraction gratings) $M_R$ will be referred to as "measurement of reference mark". Also, a measured value thereof will be referred to as "measured value of reference mark". The reference mark $M_R$ is a component of correcting means.

Denoted at $M_{i,j}$ are alignment marks each having a pattern of diffraction grating such as shown in FIG. 2B. In every circuit patter printing operation onto the semiconductor substrate 11, such an alignment mark, is printed simultaneously on the substrate, as shown in FIG. 4. The subscript "i" denotes the i-th semiconductor process and the subscript "j" denotes the j-th shot (printing) of the semiconductor substrate 1. Thus, alignment marks $M_{i,j}$, of a number corresponding to the number of the preceding printing operations, are formed at a peripheral portion of the shot area, with predetermined intervals.

For measuring the degree of accuracy of superposition of circuit patterns on the photosensitive material, having been superposed on the semiconductor substrate 11, a deviation between an alignment mark $M_{i-1, j}$ having been printed through the (i−1)-th process and an alignment mark $M_{i,j}$ having been printed through the i-th process, may be measured. Namely, a relative positional deviation between alignment marks $M_{i-1,j}$ and $M_{i,j}$ shown in FIG. 2B may be measured. Hereinafter, these two diffraction gratings will be referred to as "measurement mark", and measurement of relative positional deviation of these two diffraction gratings will be referred to as "measurement of measurement mark". A measured value thereof will be referred to as "measured value of measurement mark".

Denoted at 1 is a dual-frequency laser (laser light source) which serves as a light source for optical heterodyne interference measurement. Denoted at 2 is an auxiliary illumination light source for illuminating a positional deviation measurement region in response to a control signal S14 from a measurement control means, to be described. Denoted at 3 is first projecting means for receiving the light from the laser light source 1 and forming at least two lights suited for heterodyne interference. It illuminates a mark portion (positional deviation measurement region), to be described, with a predetermined angle of incidence. Denoted at 13 is second projecting means for illuminating the positional deviation measurement region with the light from the auxiliary illumination light source 2.

Denoted at 14 is a light receiving optical system for receiving a light beam, constituted by predetermined diffraction light 31 from the diffraction grating (mark), and for producing a beat signal S1 which is obtainable through optical heterodyne interference. Denoted at 12 is image inputting means for taking an image of the positional deviation measurement region and outputting it (imagewise signal S13) to observed image accumulating means, to be described. Denoted at 4 is a signal processing system for processing the beat signal S1 from the light receiving optical system 14 and, from the phase information thereof, it calculates the amount of relative positional deviation. The result is outputted as a measured value S2. The light receiving optical system 14 and the signal processing system 4 are components of detecting means.

Denoted at 5 is measured value storing means for storing the measured value S2 from the signal processing system 4 as well as the type of the subject of measurement and, if necessary, the moment of measurement. Denoted at 6 is a differencing means (operational means) for calculating the rate of change in a measured value of a stableness monitoring mark $M_M$ per unit time by using measured values S3 and S4 of two stableness monitoring marks $M_M$ in the measured value storing means 5. It produces an operation result S7. Denoted at 7 is standard value storing means in which a standard sequential measurement characteristic in relation to measured values of the stableness monitoring mark $M_M$ is memorized in advance.

Denoted at 8 is a comparator (comparing means) for comparing a measured value S5 of stableness monitoring mark $M_M$ and a standard data S6 of a measured value of a stableness measuring mark in the standard value storing means 7, it produces comparison result S8. Denoted at 9 is measurement control means for controlling the system as a whole and, additionally, it serves to perform measurement control and calculation as well as to maintain the precision of the system on the basis of information from respective portions of the system.

Denoted at 10 is semiconductor substrate supporting means, and denoted at 11 is a semiconductor substrate. Denoted at 15 is laser light emitted by a dual-frequency laser light source 1, and denoted at 16 is illumination light from the auxiliary illumination light source 2. Denoted at 30 is projected laser light, and denoted at 31 is diffraction light from a mark Denoted at 40 is projected auxiliary light, and denoted at 41 is reflection light of auxiliary light from the positional deviation measurement region.

Denoted at 33 is an alignment mechanism (X-Y table), and denoted at 34 is observed image accumulating means.

The operation of this embodiment will now be explained. Since the light projecting means and the light receiving means are of known type such as disclosed in U.S. Pat. No. 5,333,050 description thereof will omitted.

Laser light 15 emitted by the dual-frequency laser light source 1 goes through the first projecting means 3 and illuminates, as illumination light 30, a predetermined positional deviation measurement region with a light spot. On the other hand, the alignment mechanism 33 receives a control signal S12 from the measurement control means 9, and roughly aligns the mark to be measured, with the position of the beam spot of the illumination light 30. Here, the observed image accumulating means 34 takes the image of the portion about the beam spot of the illumination light 30. This image is then used in the mark alignment operation for moving the mark to a desired position and for discrimination the state of alignment.

Generally, once the mark alignment is completed, the mark is positioned at the measurement position and, additionally, the beam spot of the illumination light 30 is being projected to this position. Therefore, diffraction light 31 goes into the light receiving optical system 14. In this light receiving optical system 14, the light is transformed into an electric signal which bears superposition precision information, whereby a beat signal S1 is produced.

The signal processing system 4 receives the beat signal S1 and, on the basis of phase information thereof, it calculates a measured value and outputs it (S2).

The measured value S2 will now be explained.

The measured value of the stableness monitoring mark $M_M$ is $\Delta X_M, \Delta Y_M$. As described hereinbefore, the measured value should be zero if the laser light source 1 is in a completely steady state. If any drift variation or wavelength variation remains in the laser light source 1, it takes a value other than zero. In this embodiment, by using the measured value of the stableness monitoring mark $M_M$, the rate of change in the measured value per unit time is calculated and the stableness of the light source is monitored.

Measured value of the reference mark $M_R$ is $\Delta X_R, \Delta Y_R$. This is the value of apparent deviation. In order to remove an error in the measurement of the measurement marks $M_{i-1,j}$ and $M_{i,j}$, the reference mark is measured at times during the measurement operation in response to control signals from the measurement control means 9.

Measured value of the measurement mark $M_{i-1,j}$ and $M_{i,j}$ is $\Delta x_{i,j}, \Delta y_{i,j}$, and this is an apparent measured value.

Thus, as for the measured value S2, there are $(\Delta X_M, \Delta Y_M)$, $(\Delta X_R, \Delta Y_R)$ and $(\Delta x_{i,j}, \Delta y_{i,j})$. On the other hand, the measurement control means 9 applies the measurement moment t and a mark identification number to the measured value storing means 5, in response to the control signal S9. The measured value storing means 5 stores therein the measured value S2 and, as required, the measurement moment t as well as the mark identification number, as required.

In the measurement control means 9, if the measured is the apparent measured value $\Delta x_{i,j}, \Delta y_{i,j}$ of the measurement mark $M_{i-1,j}$ and $M_{i,j}$, the measurement control means 9 fetches this measured value and the apparent deviation $\Delta X_R, \Delta Y_R$ of the reference mark $M_R$ from the measured value storing means 5, as a signal S15. Then, it performs the following calculations:

$$\Delta X_{i,j} = \Delta x_{i,j} - \Delta X_R \quad (1)$$

$$\Delta Y_{i,j} = \Delta y_{i,j} - \Delta Y_R \quad (2)$$

The results are superposed to the control signal S9, and are supplied to the measured value storing means 5 as deviation measured value $\Delta X_{i,j}, \Delta Y_{i,j}$ of the measurement mark $M_{i-1,j}$ and $M_{i,j}$.

Thus, as for measured valued to be stored in the measured value storing means 5, there are three:

(1) Sequentially measured values $\Delta X_{M,p}, \Delta Y_{M,p}, \ldots$, of the stableness monitoring mark $M_R$;

(2) Measured value (apparent deviation) $\Delta X_R, \Delta Y_R$ of the reference mark $M_R$; and (3) Deviation measured value $\Delta X_{i,j}, \Delta Y_{i,j}$ of the measurement mark $M_{i-1,j}$ and $M_{i,j}$. This is the superposition error between the patterns printed, in regard to the j-th shot, through the i-th semiconductor process and the (i–1)-th semiconductor process.

In the standard value storing means 7, standard sequential characteristic ($\Delta X_{M,T}, \Delta Y_{M,T}, \ldots$) of measured values of the stableness monitoring mark $M_M$ are memorized in advance. Namely, when time t from start of energization of the dual-frequency laser light source 1 is applied via a control signal S10 to the standard value storing means 7 from the measurement control means 9, the standard value storing means 7 selects a standard data of the measured value of the stableness monitoring mark $M_M$ corresponding to the time t (=T), out of the memory, and applies it to the comparator 8 as a standard data S6.

In response to a control signal S9 from the measurement control means 9, measured values ($\Delta X_{M,t1}, \Delta Y_{M,t1}$) and ($\Delta X_{M,t2}, \Delta Y_{M,t2}$) of two stableness monitoring marks $M_{M,t}$ are selected out of those data accumulated in the memorized value storing means 5, and they are applied to the differencing circuit 6 as measured values S3 and S4. These measured values S3 and S4 are those data having been measured at times t1 and t2 which are relatively close to each other. In response, the differencing circuit 6 performs the following operation:

$$\zeta = (\Delta X_{M,t1} - \Delta X_{M,t2})/(t1-t2) \qquad (3)$$

$$\eta = (\Delta Y_{M,t1} - \Delta Y_{M,t2})/(t1-t2) \qquad (4)$$

The result of the operation (signal S7) represents the rate of change of the measured value of the stableness monitoring mark $M_M$ between two juxtaposed time moments (i.e., t1 to t2).

On the other hand, the comparator 8 receives recently measured value S5 ($\Delta X_{M,t}, \Delta Y_{M,t}$) of the stableness monitoring mark $M_M$ from the measured value storing means 5, and it performs discrimination as to whether it is within a certain range with respect to the standard data ($\Delta X_{M,T}, \Delta Y_{M,T}$) applied from the standard value storing means 7. The result is applied to the measurement control means as a comparison result S8. If the value is largely deviated from the standard data, the measurement control means 9 discriminates any disorder in the laser light source 1, and produces an alarm toward the outside of the apparatus.

The measurement control means 9 having received the operation result S7 ($\zeta, \eta$) of the differencing circuit 6 and the comparison result S8 of the comparator 8, operates to turn on or off the auxiliary illumination light source 2, or to increase or decrease the frequency of measurements to the stableness monitoring mark $M_M$ and/or the reference mark $M_R$.

FIGS. 5–8 are flow charts for explaining the operation in the first embodiment.

Figure 5:
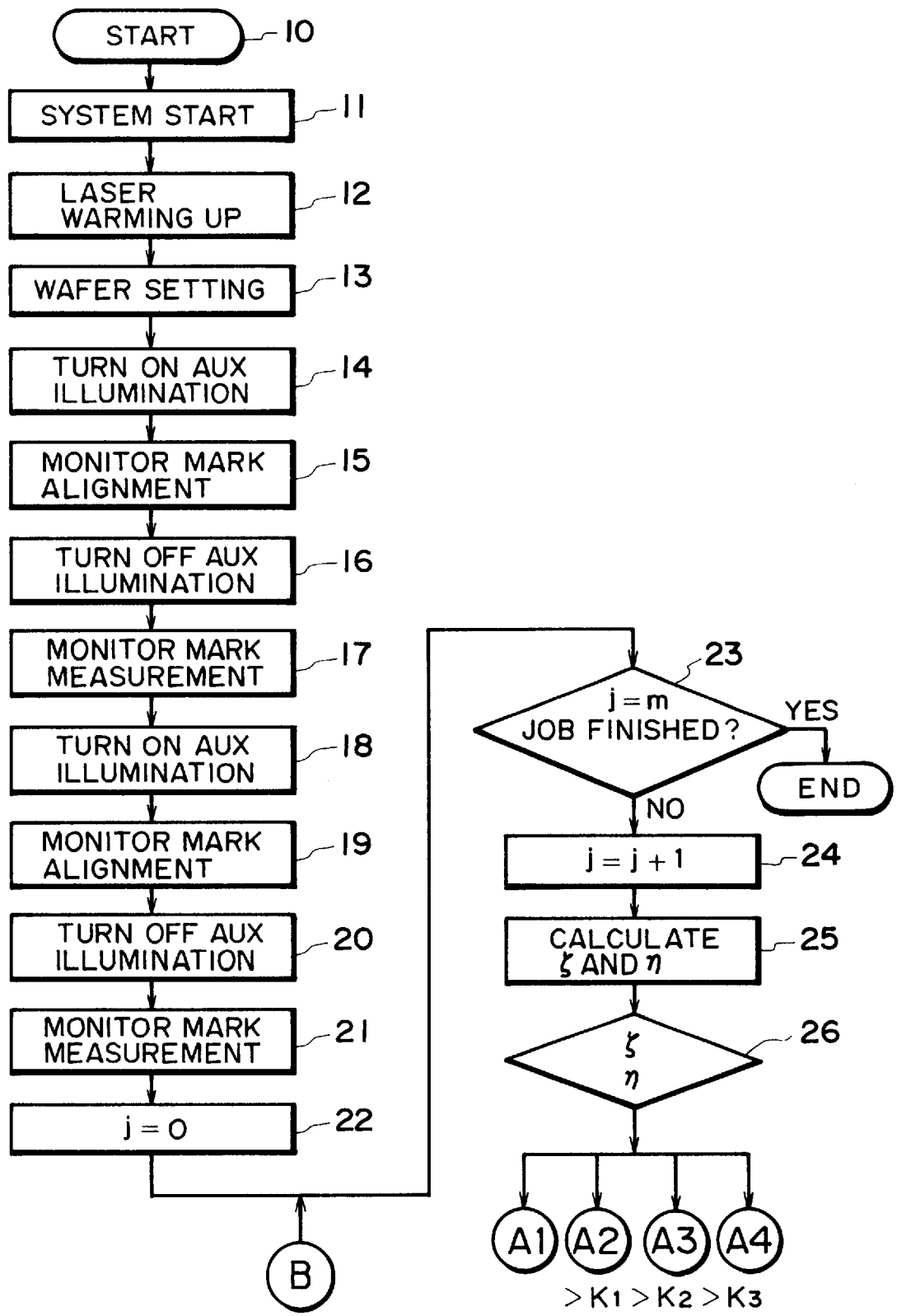
FIG. 5 is a first flow chart related to the first embodiment.

FIG. 5 is a flow chart from the energization of the system to start of measurement to a first shot of a semiconductor substrate. Initially, at Step 10 the power source of the system of this embodiment is turned on. Then, at Step 11, initialization of respective portions of the system is executed. For example, electrical initialization such as operation mode setting to electronic circuits or the like, and mechanical initialization such as origin determination to the alignment mechanism or the like, are performed. Subsequently, at Step 12, accomplishment of steady state of the dual-frequency laser is waited for. Usually, a commercially available dual-frequency laser is equipped with an indicator or a signal output for discrimination of the steady state and, therefore, to discriminate it is easy.

After this warming-up, generally the dual-frequency laser light source 1 comes into a steady state. However, as described hereinbefore, in regard to the directional variation of emitted light, both of drift-like variation and vibration-like variation remain even after the warming-up. Usually, the drift-like variation substantially extinguishes after the lapse of a few hours. However, during this period, the beam spot position on the semiconductor substrate is displaced. As a result of this, during a few hours after the start of the system, in the mark alignment operation, the beam spot may be projected with a deviation from the predetermined position due to a drift-like variation. Therefore, illumination non-uniformness may be produced in the observed image, observing that predetermined position, and this makes it difficult to check the alignment or to perform mark moving.

The present embodiment however assures alignment checking or mark moving, even when the drift-like variation is not attenuated.

At Step 13, a semiconductor substrate 11 is placed on the semiconductor substrate supporting portion 10.

Then, in the present embodiment, at Step 14 the auxiliary illumination light source 12 is turned on. This is to make sure that the mark is illuminated uniformly by this auxiliary illumination light source even if drift-like variation remains in the laser light source 1 so that the laser light illuminates the mark portion with eccentricity. This enables mark alignment checking or mark moving, positively. Thereafter, at Step 15, the stableness monitoring mark $M_M$ is placed at a measurement position. At Step 16, the auxiliary illumination light source 2 unnecessary to positional deviation measurement is turned off. At Step 17, first time measurement to the stableness monitoring mark $M_M$ is performed.

Subsequently, at Steps 18–21, the stableness monitoring mark $M_M$ is measured once more.

With these two measurements to the stableness monitoring mark $M_M$, the rate of change in measured value of this mark is detected.

The measurement of a superposition error of every shot on the semiconductor substrate 11 starts here. First, at Step 22, "j=0" is set and the sequence goes to Step 23. This is a discrimination step as to whether measurements to all shots are completed. The result is of course negative, and the sequence goes to Step 24 where "j" is incremented by one. The sequence goes to the procedure for measurement of the first shot. At step 25, measured values of the stableness monitoring mark $M_M$ produced at recent two moments t1 and t2 are used, and the rate of change $\zeta$ and $\eta$ is calculated.

From Step 26 the sequence branches to A1 to A4, depending on the values of $\zeta$ and $\eta$. Namely, the rate of change $\zeta$ and $\eta$ is classified into four zones. If it is in the largest zone, the sequence goes to A1. If the values $\zeta$ and $\eta$ of the rate of change are in the second or subsequent zone, the sequence goes to A2. Similarly, the sequence may go to A3 or A4.

Figure 6:
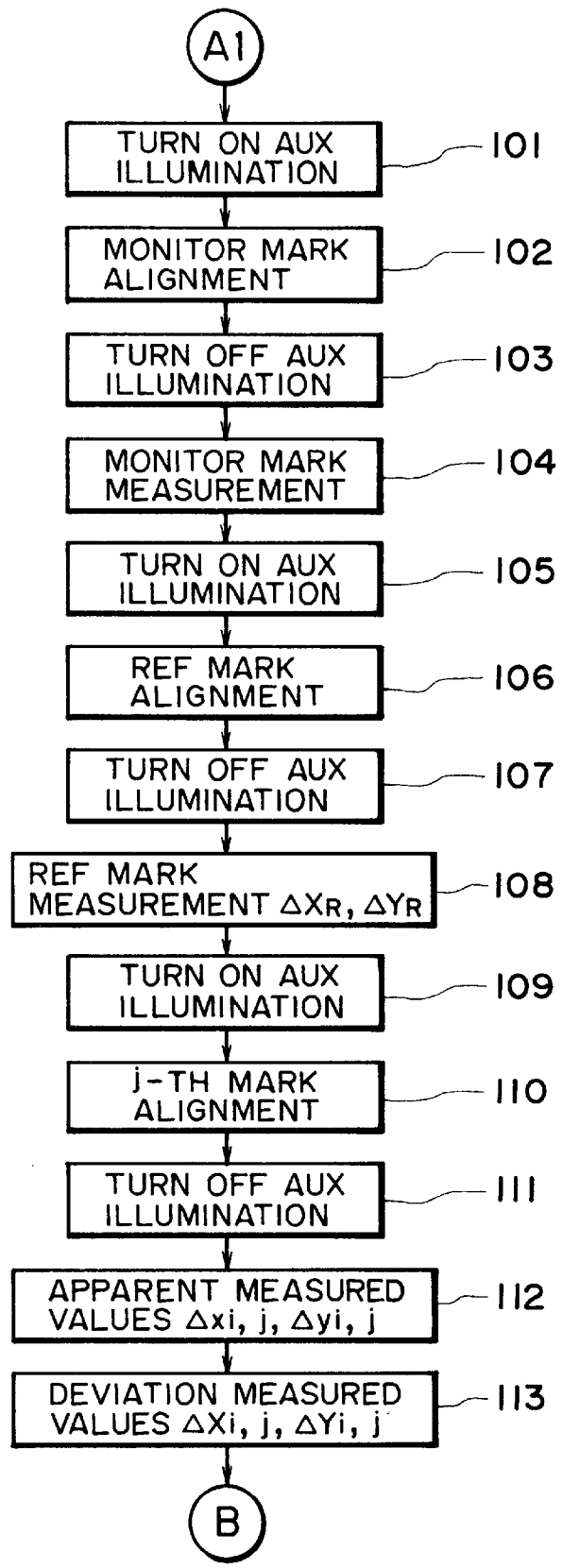
FIG. 6 is a second flow chart related to the first embodiment.
Figure 7:
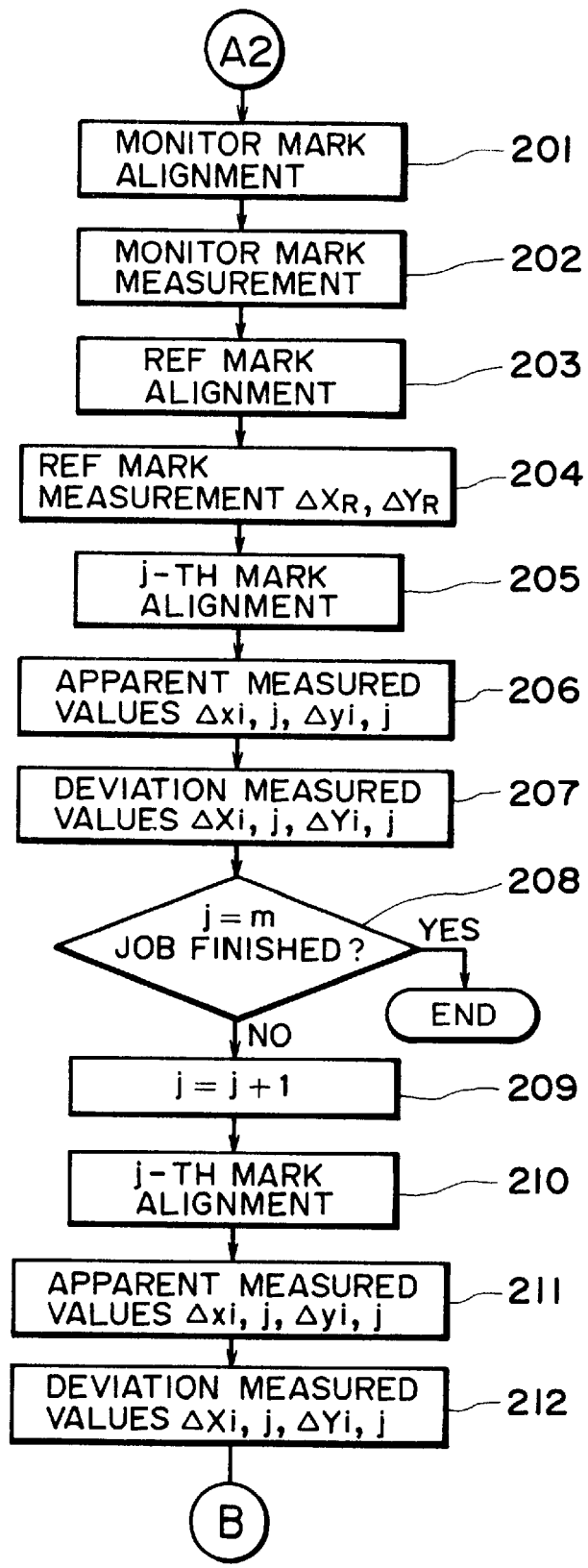
FIG. 7 is a third flow chart related to the first embodiment.
Figure 8:
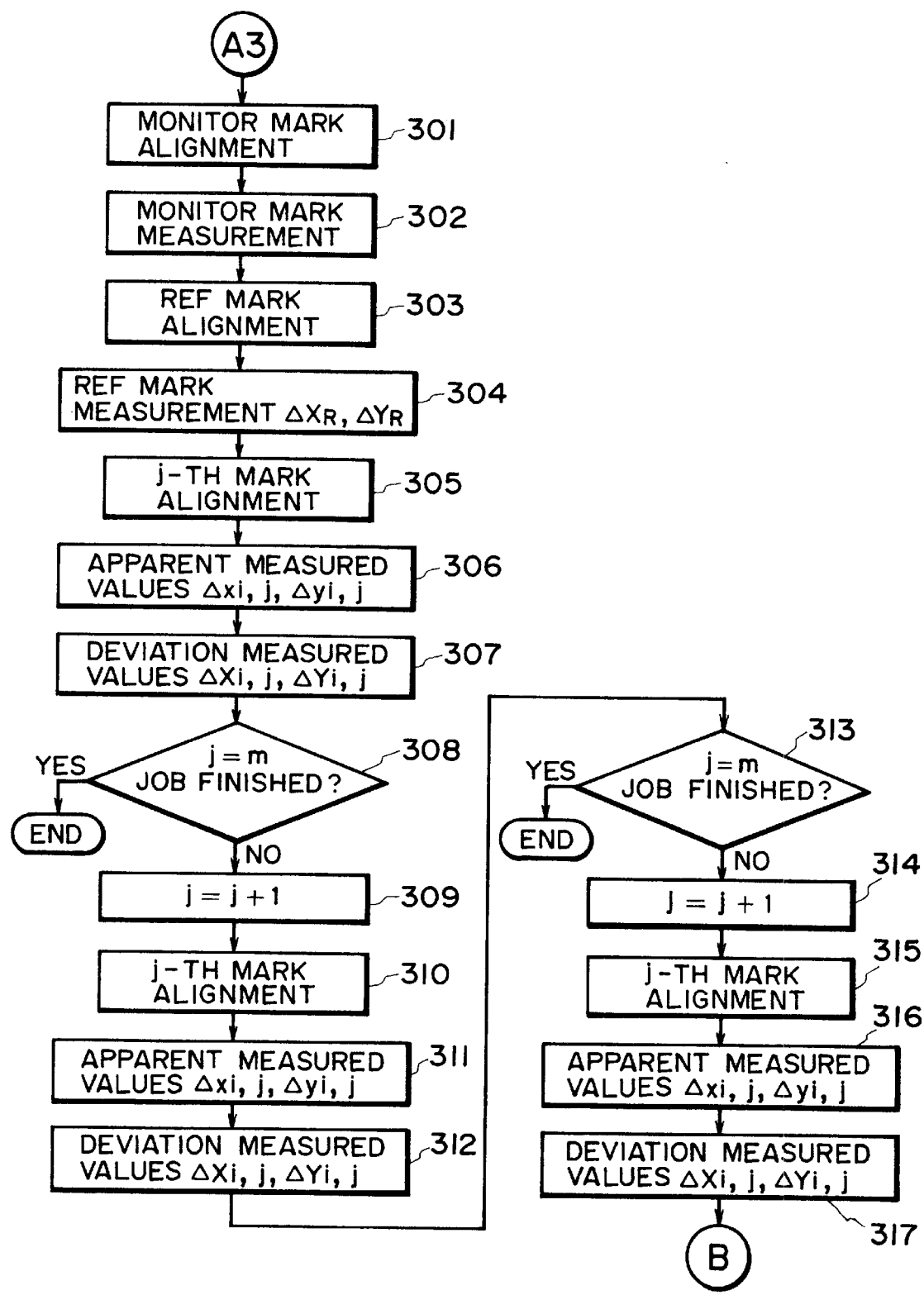
FIG. 8 is a fourth flow chart related to the first embodiment.
Figure 9:
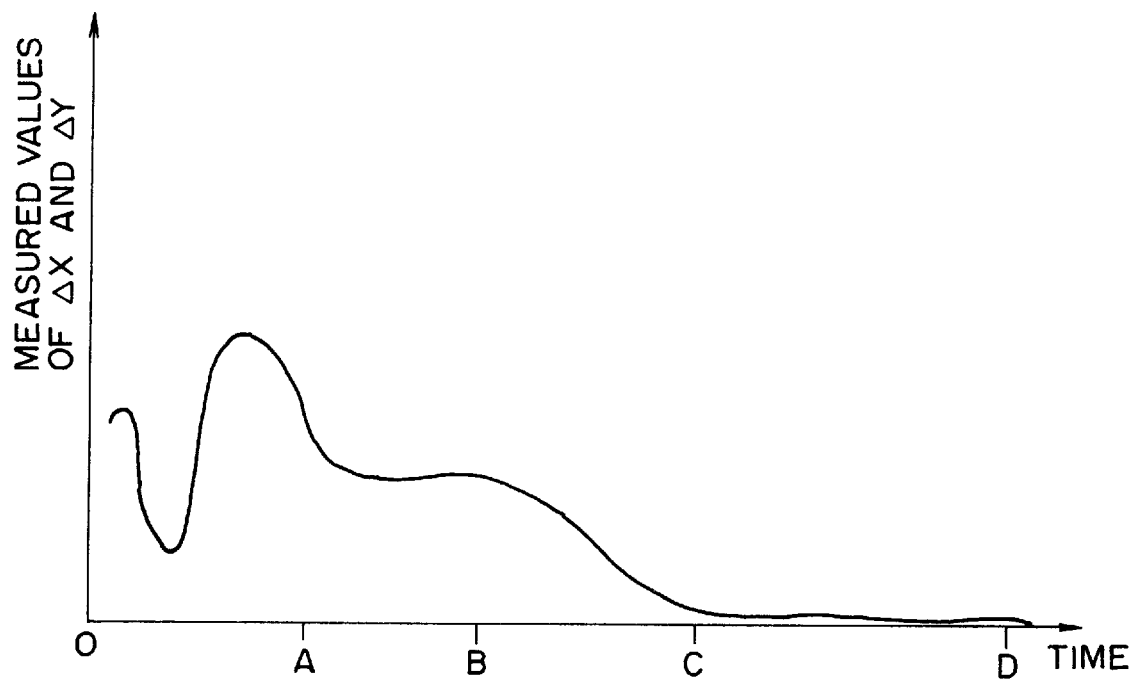
FIG. 9 is a graph for explaining a characteristic, with respect to time, of a measured value of the stableness monitoring mark of the first embodiment.

Now, it is assumed that the values of $\zeta$ and $\eta$ of the rate of change are in the largest zone and the sequence goes to A1. In this example, as shown in FIG. 6, for deviation measurement to the j-th shot, every time the auxiliary illumination light source 2 is turned on to illuminate the mark. Also, before every deviation measurement, measurements of the stableness monitoring mark $M_M$ and the reference mark $M_R$ are performed.

This procedure will be explained below. At Step 101, the auxiliary illumination light source 2 is turned on. This is to make it sure to perform alignment or mark moving by illumination of the measurement mark with the auxiliary illumination light source 2, since at the stage where the drift variation of the laser light source 1 is not yet saturated the beam spot of the laser light source 1 may be displaced from the center of the measurement mark. In such state, if the observed imaged is taken by illumination with the laser light, a portion of the image may be missed, making it difficult to perform alignment or mark moving.

Subsequently, at Step 102, the stableness monitoring mark $M_M$ is brought into alignment with a measurement position. At Step 103, the auxiliary illumination light source 2 unnecessary to the measurement is turned off. At Step 104, the stableness monitoring mark $M_M$ is measured, whereby a measured value $\Delta X_{M,t}, \Delta Y_{M,t}$ is obtained.

At Steps 105–108, similar operations are made to the reference mark $M_R$, whereby apparent deviation value $\Delta X_R$, $\Delta Y_R$ is obtained.

At Steps 109–112, similar operations are made to the measurement mark $M_{i-1,j}$ and $M_{i,j}$, whereby apparent measured value $\Delta x_{i,j}, \Delta y_{i,j}$ is obtained. Then, at Step 113, calculations (1) and (2) are executed, whereby deviation measured value $\Delta X_{i,j}, \Delta Y_{i,j}$ is obtained. Thus, measurements to the first shot are completed. Subsequently, the sequence goes to point B of FIG. 5, followed by job completion discrimination, calculation of rate of change for the measurement and branching.

The flow chart following A1 illustrates that: if the drift variation of the laser light source 1 is large, every time, the stableness monitoring mark $M_M$ and the reference mark $M_R$ are measured, and the rate of change $\zeta$ and $\eta$ is checked repeatedly every time the deviation measurement to one shot is effected. Also, every time, apparent deviation $\Delta X_R, \Delta Y_R$ of the reference mark $M_R$ is measured.

If the rate of change $\zeta$ and $\eta$ is in the second zone, the flow branches to A2. The processes following A2 of FIG. 7 will now be explained. In this case, the rate of change $\zeta$ and $\eta$ becomes smaller, to some degree, and the drift variation of the dual-frequency laser light source 1 in the direction of light projection is approximately saturated. Thus, the laser light illuminates the mark portion positively, and the auxiliary illumination light source 2 is unnecessary. Therefore, as in FIG. 7, the auxiliary light source 2 is not used. Basically, the stability monitoring mark $M_M$ and the reference mark $M_R$ are measured once, and deviation of two shots is measured.

At Steps 201 and 202, measurement of the stableness monitoring mark $M_M$ is executed. The difference from the flow of A1 is that the auxiliary illumination light source is not turned on.

Subsequently, at Steps 203 and 204, the reference mark $M_R$ is measured, whereby apparent deviation value $\Delta X_R$, $\Delta Y_R$ is obtained.

Then, at Steps 205 and 207, a superposition error measurement is made with respect to the j-th shot. Namely, alignment and measurement are performed to the measurement mark $M_{i-1,j}$ and $M_{i,j}$, whereby an apparent measured value $\Delta x_{i,j}, \Delta y_{i,j}$ is obtained. Thereafter, at Step 207, calculations (1) and (2) are executed, whereby deviation measured value $\Delta X_{i,j}, \Delta Y_{i,j}$ is obtained. The measurement to the j-th shot is thus completed.

Subsequently, at Step 208 of discrimination, whether measurements to all shots are completed or not is discriminated. The sequence is followed by measurement completion or continuing steps.

If continuing step is selected, the sequence goes to Step 209 where "j" is incremented by 1. At Steps 210 and 211, alignment and measurement are executed to the measurement mark $M_{i-1,j}$ and $M_{i,j}$, whereby apparent measured value $\Delta x_{i,j}, \Delta y_{i,j}$ is obtained. Then, at Step 212, calculations (1) and (2) are performed, whereby deviation measured value $\Delta x_{i,j}, \Delta Y_{i,j}$ is obtained. Measurements to the j-th shot are thus completed. Then, the sequence goes to point B of FIG. 5, followed by job completion discrimination, and calculation of the rate of change for subsequent measurement and branching.

As described above, in the flow of A2, since the drift variation has been approximately saturated, the auxiliary illumination light source 2 is not turned on and deviation measurement to two shots is performed on the basis of a single measurement to the stableness monitoring mark $M_M$ and reference mark $M_R$. Therefore, as compared with the flow of A1, the throughput is higher.

If the rate of change $\zeta$ and $\eta$ is in the third zone, the flow branches to A3. Sequential processes following A3 in FIG. 8 will now be explained. In this case, the processes are similar to those of the flow of A2. However, since in this case the drift variation of the laser has been more saturated as compared with the example of A2, the deviation measurement is done to three shots, on the basis of basically a single measurement to the stableness monitoring mark $M_M$ and reference mark $M_R$.

Thus, it enables further enhancement of throughput than the case of A2.

A description of the details of the flow of A4 will be omitted. Since in this case the drift variation is saturated more, measurement may be made to four shots or more on the basis of a single measurement to the stableness monitoring mark $M_M$ and reference mark $M_R$.

FIGS. 10–13 illustrate a second embodiment of the present invention. In this embodiment, a positional deviation measuring system is incorporated into a semiconductor device manufacturing apparatus, for measurement of superposition precision.

Figure 10:
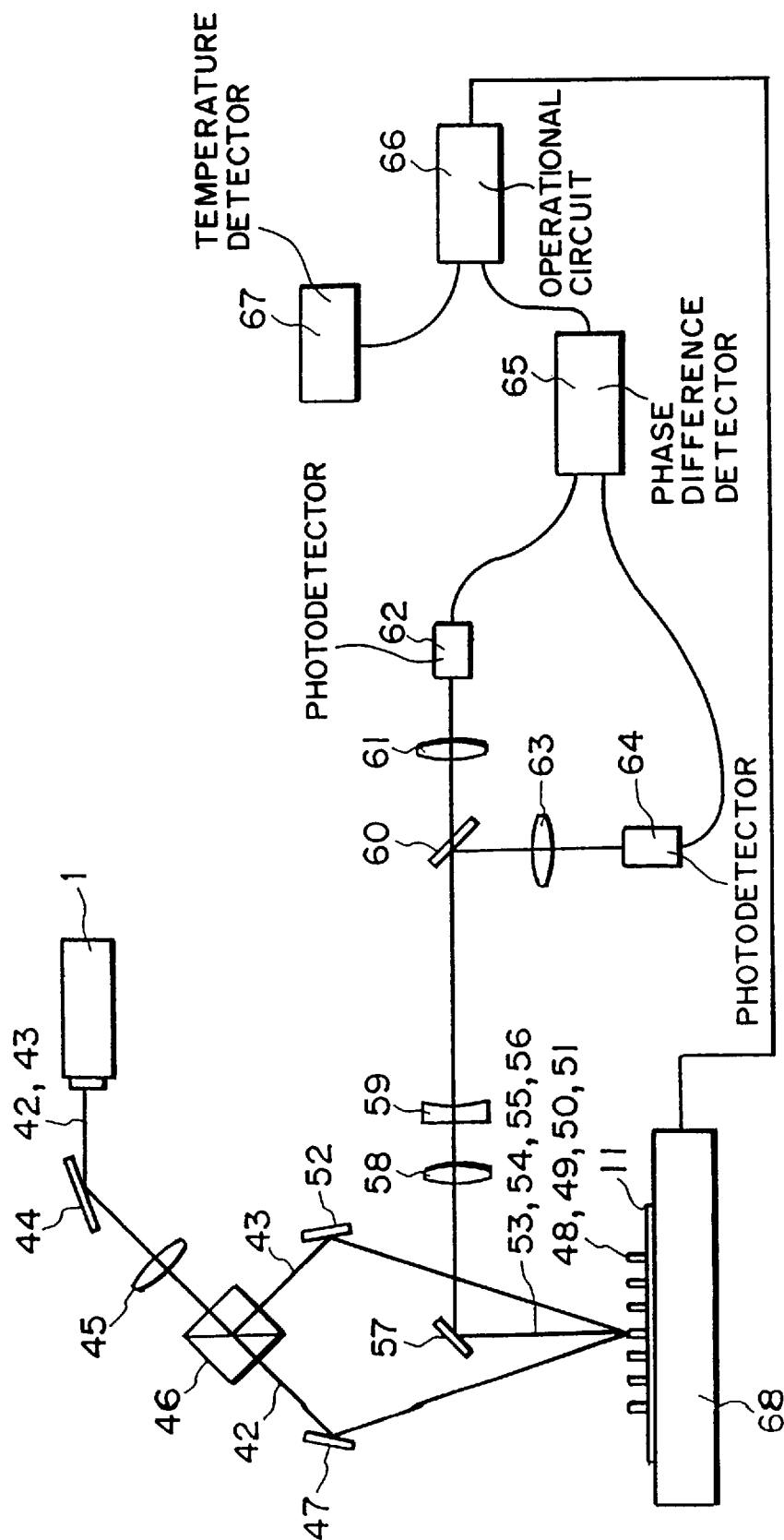
FIG. 10 is a schematic view of an optical arrangement of a second embodiment of the present invention.
Figure 11:
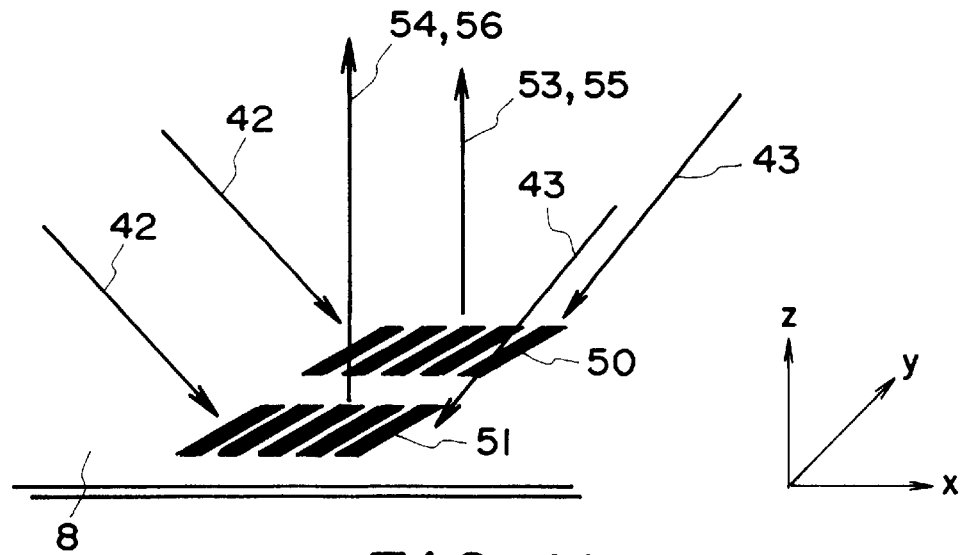
FIG. 11 is a schematic view for explaining projection of light and placement of measurement mark.
Figure 12:
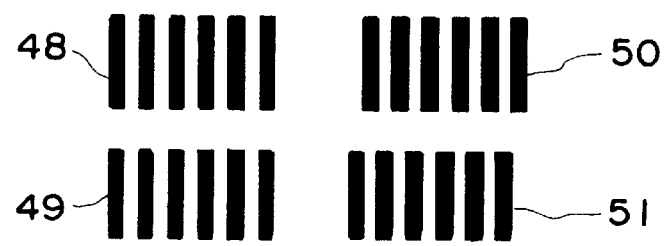
FIG. 12 is an enlarged view for explaining a mark on a wafer to be measured.
Figure 13:
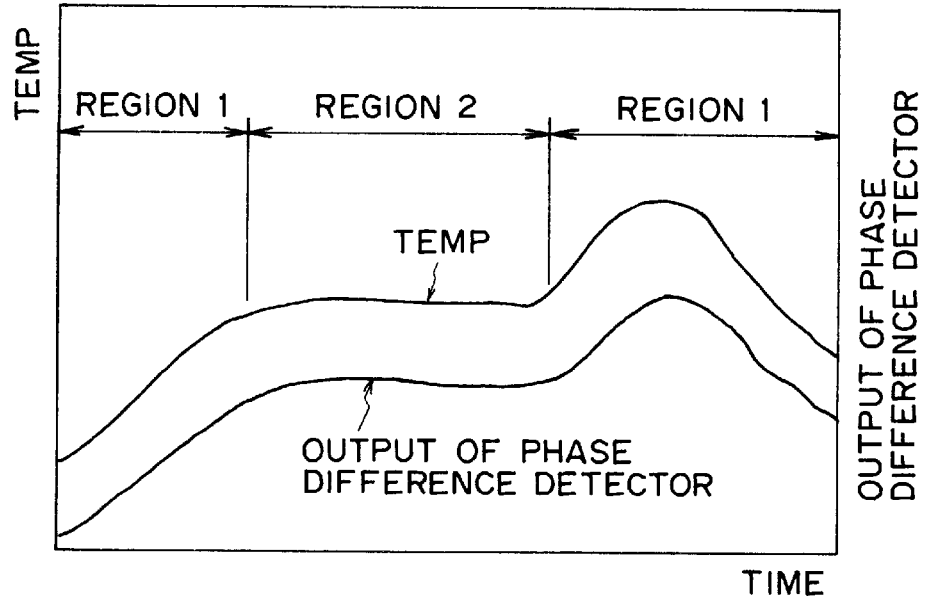
FIG. 13 is a graph for explaining the relation between a temperature change and an output of a phase difference detector.

FIG. 10 is a schematic view of an optical arrangement of this embodiment, and FIG. 11 illustrates projected light and a measurement mark. FIG. 12 illustrates a mark for measurement of a wafer, and FIG. 13 illustrates the relation between a change in temperature and an output of a phase difference detector.

FIG. 12 shows a portion of a wafer having marks to be measured actually. The measurement of superposition precision is performed such that: measurement is made to reference marks 48 and 49 comprising a pair of diffraction gratings having a predetected relative positional deviation; the obtained measured value is taken as a reference value; measurement is subsequently made to measurement marks 50 and 51 provided for measurement of a deviation between the i-th layer and the (i–1)-th layer; and the obtained measured value is taken as a deviation measured value. By comparing the deviation measured value with the reference value, a real deviation measured value having removed any measurement error due to inherent aberration of the measurement optical system or to rotation of the wafer along it surface, is obtainable. Usually, a single measurement is done to the reference marks 48 and 49. The obtained reference value is memorized in the computer 64 and, thereafter, measurement marks provided on the wafer 11 at different positions are measured sequentially. By comparing measured values with the reference value, real deviation measured values with respect to the respective measurement mark positions on the wafer are detected.

Referring now to FIGS. 10 and 11, the principle and flow of the measurement will be explained.

In FIG. 10, a dual-frequency laser light source 1 produces two lights 42 and 43 lying on the same optical axis but having mutually orthogonal polarization planes and slightly different frequencies. Here, the light 42 comprises P-polarized light, and light 43 comprises S-polarized light, for example. If the complex amplitude of the light 42 is denoted by $E_1$, and the complex amplitude of the light 43 is denoted by $E_2$, these complex amplitudes $E_1$ and $E_2$ are expressed as follows:

$$E_1 = A \exp\{iw_1 t\} \tag{10}$$

$$E_2 = B \exp\{iw_2 t\} \tag{11}$$

wherein A and B are amplitudes, and $w_1$ and $w_2$ are angular frequencies. The two lights 42 and 43 are deflected by a mirror 44 and, after passing through a lens 45, they are projected on a polarization beam splitter 46. The two lights incident on the polarization beam splitter 46 are split by the beam splitting plane thereof into two directions, depending on their difference in polarization direction. The light 42 of P-polarization passed through the beam splitting plane of the polarization beam splitter 46 is deflected by a mirror 47, and it illuminates the reference marks 48 and 49 and the measurement marks 50 and 51 on the wafer 11.

On the other hand, the light 43 of S-polarization as reflected by the beam splitting plane of the polarization beam splitter 46 is deflected by a mirror 52, and similarly it illuminates the reference marks 48 and 49 and the measurement marks 50 and 51 on the wafer 11.

As shown in FIG. 11, these lights 42 and 43 are reflectively diffracted by the measurement marks 50 and 51. Negative first order diffraction lights 53 and 54 (in regard to the light 42) and positive first order diffraction lights 55 and 56 (in regard to the light 43) enter a detection system of FIG. 10, comprising a mirror 57 and elements following it. Of these diffraction lights, the diffraction lights 53 and 55 are those as obtainable from the measurement mark 50 on the wafer. Also, the diffraction lights 54 and 56 are those obtainable from the measurement mark 51 on the wafer. The complex amplitudes of these four diffraction lights 53, 54, 55 and 56 are expressed by the following equations:

$$E_3 = A_1 \cdot \exp\{i(w_1 t - \phi_a)\} \tag{12}$$

$$E_4 = A_2 \cdot \exp\{i(w_1 t - \phi_b)\} \tag{13}$$

$$E_5 = B_1 \cdot \exp\{i(w_2 t + \phi_a)\} \tag{14}$$

$$E_6 = B_1 \cdot \exp\{i(w_2 t - \phi_b)\} \tag{15}$$

wherein $E_3$, $E_4$, $E_5$ and $E_6$ correspond to the diffraction lights 53, 54, 55 and 56, respectively. Also, $A_1$, $A_2$, $A_3$ and $A_4$ are the amplitudes of these diffraction lights, respectively, and $\phi_a$ and $\phi_b$ are phase quantities corresponding to deviations $x_a$ and $x_b$ of the measurement marks 50 and 51, respectively, from the reference position. They can be expressed as follows:

$$\phi_a = 2\pi \cdot x_a / p \tag{16}$$

$$\phi_b = 2\pi \cdot x_b / p \tag{17}$$

In FIG. 10, the four diffraction lights 53–56 are deflected by a mirror 57 and, after passing through a lens 58, they are received by a polarizer 59 by which their polarization planes are registered. Subsequently, the diffraction lights are separated by an edge mirror 60 which is disposed at the position optically conjugate with the measurement marks 50 and 51 with respect to the lens 58, into diffraction lights 53 and 55 (from the measurement mark 50) and diffraction lights 54 and 56 (from the measurement mark 51).

The diffraction lights 53 and 54 transmitted through the edge mirror 60 are imaged by a lens 61 upon a photodetector 62, whereby it is photoelectrically converted. On the other hand, the diffraction lights 54 and 56 reflected by the edge mirror 60 are imaged by a lens 63 upon a photodetector 64, whereby it is photoelectrically converted. Beat signal $I_1$ produced by the photodetector 62 and beat signal $I_2$ produced by the photodetector 64, are expressed by the following equations:

$$I_1 = A_1^2 + B_1^2 + 2A_1 B_1 \cos\{2\pi(w_2 - w_1)t + 2\phi_a\} \tag{18}$$

$$I_2 = A_2^2 + B_2^2 + 2A_2 B_1 \cos\{2\pi(w_2 - w_1)t + 2\phi_b\} \tag{19}$$

where $A_1^2 + B_1^2$ and $A_2^2 + B_2^2$ are DC components, and $2A_1 B_1$ and $2A_2 B_2$ are amplitudes. Detecting a phase difference $\Delta\phi$ between the beat signals $I_1$ and $I_2$ with a phase difference detector 65, it follows that:

$$\Delta\phi = 2(\phi_a - \phi_b) \tag{20}$$

From $\Delta\phi$, relative positional deviation $x_2$ of the measurement marks 50 and 51 is detected through the optical heterodyne detection means, as follows:

$$x_2 = x_b - x_a = p\Delta\phi / 4\pi \tag{21}$$

While the principle and flow of measurement have been explained with reference to the measurement marks, substantially the same applies to the reference marks.

Here, if there occurs a change in temperature of the ambience gas in which the precision measuring system of this embodiment is placed, the output of the phase difference detector 65 changes accordingly. If the output of the phase difference detector 65 changes with a temperature change in the ambience, and if the time interval between the moment of measurement to the reference marks 48 and 49 and the moment of measurement to the measurement marks 50 and 51 is large, the real deviation measured value, which should be obtained by comparing the deviation measured value with the reference value, becomes inaccurate.

In consideration thereof, a change in temperature of the ambience gas may be monitored with a temperature detector 67. Also, through an operation circuit, the rate of change in temperature per unit time may be calculated. Also, comparison may be made to the rate of change in output level of the phase difference detector and the rate of change in temperature per unit time, having been memorized in the operational circuit 66 in advance. Finally, based on the above, the frequency of measurement to the reference mark may be determined.

When the reference mark is going to be measured, the operation circuit 66 may apply a control signal to the wafer stage 68 so as to move it so that the reference mark is placed at the measurement position.

Assuming now an example of FIG. 13 wherein the temperature of the ambience in which the superposition precision measuring system is placed changes with time as illustrated. In the period of region 1, the rate of temperature change is large and the output of the phase difference detector 65 changes accordingly. In such case, the measurements to the reference marks 48 and 49 may be increased in accordance with the rate of temperature change. In the period of region 2 wherein the ambience temperature is stable, measurements to the reference marks 48 and 49 may be decreased. This assures high precision and high efficiency measurement.

Here, the frequency of measurements m, that is, the ratio of a single measurement of the reference mark to the number of measurement marks to be measured, is determined as follow:

$$0 < m < a/(txc) \text{ (m is an integer)}$$

where t is the measurement time period per one mark, c is the rate of change in output value of the phase difference detector per unit time due to a temperature change, and a is a desired measurement precision.

Also, the frequency T with respect to time, that is, the time interval between measurements to the reference mark, is determined as follow:

T≦a/c

While the invention has been described with reference to the structures disclosed herein, it is not confined to the details set forth and this application is intended to cover such modifications or changes as may come within the purposes of the improvements or the scope of the following claims.

What is claimed is:

1. A method of measuring information related to an object, comprising the steps of:

measuring a change of a measurement error with respect to time;

determining frequency of measurements for measuring the measurement error, to be done during a measurement period, on the basis of the change in measurement error; and correcting, after measurement of the measurement error and before a subsequent measurement of a measurement error at the determined frequency all measured values related to the information of the object on the basis of the same measurement error having been measured.

2. A method according to claim 1, further comprising setting a time interval T for measurement of the measurement error in the measurement period to satisfy a relation:

T≦a/c wherein a is a rate of change of measurement error with respect to time and c is a desired measurement precision.

3. A method of detecting a positional deviation between two objects, comprising the steps of:

measuring a positional deviation of two references having a predetermined mutual positional deviation, to detect a change with respect to time, of a measurement error in the detection of the positional deviation of the two objects;

determining, on the basis of the change in measurement error, frequency of measurements for measuring the measurement error to be done during a measurement *period for the measurement to the two objects, through detection of the positional deviation of the two references; and correcting, after measurement of the measurement error and before a subsequent measurement of measurement error at the determined frequency, all measured values related to the positional deviation of the two objects on the basis of the same measurement error having been measured.

4. A method according to claim 3, further comprising setting a time interval T for measurement of the measurement error in the measurement period to satisfy a relation:

T≦a/c wherein a is a rate of change of the measurement error with respect to time and c is a desired measurement precision.

5. A positional deviation detecting system for detecting a positional deviation between two objects, said system comprising:

two references having a predetermined mutual positional deviation;

memory means for memorizing a detected value of the positional deviation of the references;

calculating means for calculating a change, with respect to time, of a measurement error in the detection of the positional deviation of the two objects, on the basis of the memorized detected value of the positional deviation of the references;

determining means for determining, on the basis of the change in measurement error, a frequency of measurements for measuring the measurement error to be done during a measurement period for the measurement to the two objects, through detection of the positional deviation of the two references; and correcting means for correcting, after measurement of the measurement error and before a subsequent measurement of a measurement error at the determined frequency, all measured values of positional deviation of the two objects on the basis of the same measurement error having been measured.

6. A system according to claim 5, further comprising means for setting a time interval T for measurement of the measurement error in the measurement period to satisfy a relation:

T≦a/c wherein a is a rate of change of the measurement error with respect to time and c is a desired measurement precision.

* * * * *

UNITED STATES PATENT AND TRADEMARK OFFICE
CERTIFICATE OF CORRECTION

PATENT NO. : 5,847,974

DATED : December 8, 1998

INVENTORS : TETSUZO MORI, ET AL.

It is certified that error appears in the above-identified patent and that said Letters Patent is hereby corrected as shown below:

ON THE COVER PAGE

At item [56], under "References Cited", "FOREIGN PATENT DOCUMENTS", "04212002  8/1992  Japan" should read --4-212002  8/1992  Japan--.

COLUMN 1:

line 53, "$\Delta X=\Delta y=0$" should read --$\Delta X=\Delta Y=0$--.

COLUMN 2:

line 1, "of about tens" should read --for about ten--;
line 10, "become" should read --becomes--;
line 13, "become" should read --becomes--; and
line 54, "object;" should read --objects;--.

COLUMN 3:

line 9, "object," should read --objects,--.

COLUMN 4:

line 36, "patter" should read --pattern--.

UNITED STATES PATENT AND TRADEMARK OFFICE
CERTIFICATE OF CORRECTION

PATENT NO. : 5,847,974

DATED : December 8, 1998

INVENTORS : TETSUZO MORI, ET AL.

It is certified that error appears in the above-identified patent and that said Letters Patent is hereby corrected as shown below:

COLUMN 5:

line 51, "mark" should read --mark.--.

COLUMN 6:

line 6, "nation" should read --nating--;
    line 45, "measured" should read --measured value--;
    line 59, "valued" should read --values--; and
    line 60, "three:" should read --three of them:--.

COLUMN 7:

line 53, "start" should read --the start--.

COLUMN 9:

line 1, "imaged" should read --image--; and
    line 66, "$\Delta x_{i,j},$" should read --$\Delta X_{i,j},$--.

COLUMN 10:

line 51, "it" should read --its--.

UNITED STATES PATENT AND TRADEMARK OFFICE
CERTIFICATE OF CORRECTION

PATENT NO. : 5,847,974

DATED     : December 8, 1998

INVENTORS : TETSUZO MORI, ET AL.

It is certified that error appears in the above-identified patent and that said Letters Patent is hereby corrected as shown below:

COLUMN 12:

line 64, "follow:" should read --follows:--.

COLUMN 13:

line 5, "follow:" should read --follows:--; and
    line 44, "*period" should read --period--.

Signed and Sealed this

Fourteenth Day of September, 1999

Attest:

Q. TODD DICKINSON

*Attesting Officer*  *Acting Commissioner of Patents and Trademarks*